USOO5659492A

United States Patent [19]
Li et al.

[11] Patent Number: 5,659,492
[45] Date of Patent: Aug. 19, 1997

[54] CHEMICAL MECHANICAL POLISHING ENDPOINT PROCESS CONTROL

[75] Inventors: Leping Li, Poughkeepsie; Steven George Barbee, Dover Plains; Arnold Halperin, Cortlandt Manor, all of N.Y.

[73] Assignee: International Business Machines Corporation, Armonk, N.Y.

[21] Appl. No.: 620,721

[22] Filed: Mar. 19, 1996

[51] Int. Cl.⁶ .............................. H01L 21/66; B24B 49/16
[52] U.S. Cl. ........................... 364/569; 324/71.5; 451/41
[58] Field of Search .................. 364/569, 474.06, 364/137; 324/71.5, 228–229, 230; 451/41, 28, 285, 287; 156/625.1, 626.1, 636.1; 427/8–10, 355, 367, 369; 437/8, 255

[56] References Cited

U.S. PATENT DOCUMENTS

| Re. 34,425 | 11/1993 | Schultz | 364/474.06 |
|---|---|---|---|
| 5,036,015 | 7/1991 | Sandhu et al. | 437/8 |
| 5,069,002 | 12/1991 | Sandhu et al. | 437/225 |
| 5,081,796 | 1/1992 | Schultz | 364/474.06 |
| 5,240,552 | 8/1993 | Yu et al. | 156/636 |
| 5,245,794 | 9/1993 | Salugsugan | 451/41 |
| 5,433,651 | 7/1995 | Lustig et al. | 451/6 |
| 5,559,428 | 9/1996 | Li et al. | 324/71.5 |

*Primary Examiner*—James P. Trammell
*Assistant Examiner*—Bryan Bui
*Attorney, Agent, or Firm*—Alison D. Mortinger

[57] ABSTRACT

A method and apparatus are provided for determining the endpoint for chemical mechanical polishing a film on a wafer. First, a reference point polishing time indicating when a breakthrough of the film has occurred is determined, then an overpolishing time indicating an interval between the reference point polishing time and when the film has been completely polished is determined. To get the total polishing time to the endpoint, the reference point polishing time and the overpolishing time are added.

24 Claims, 1 Drawing Sheet

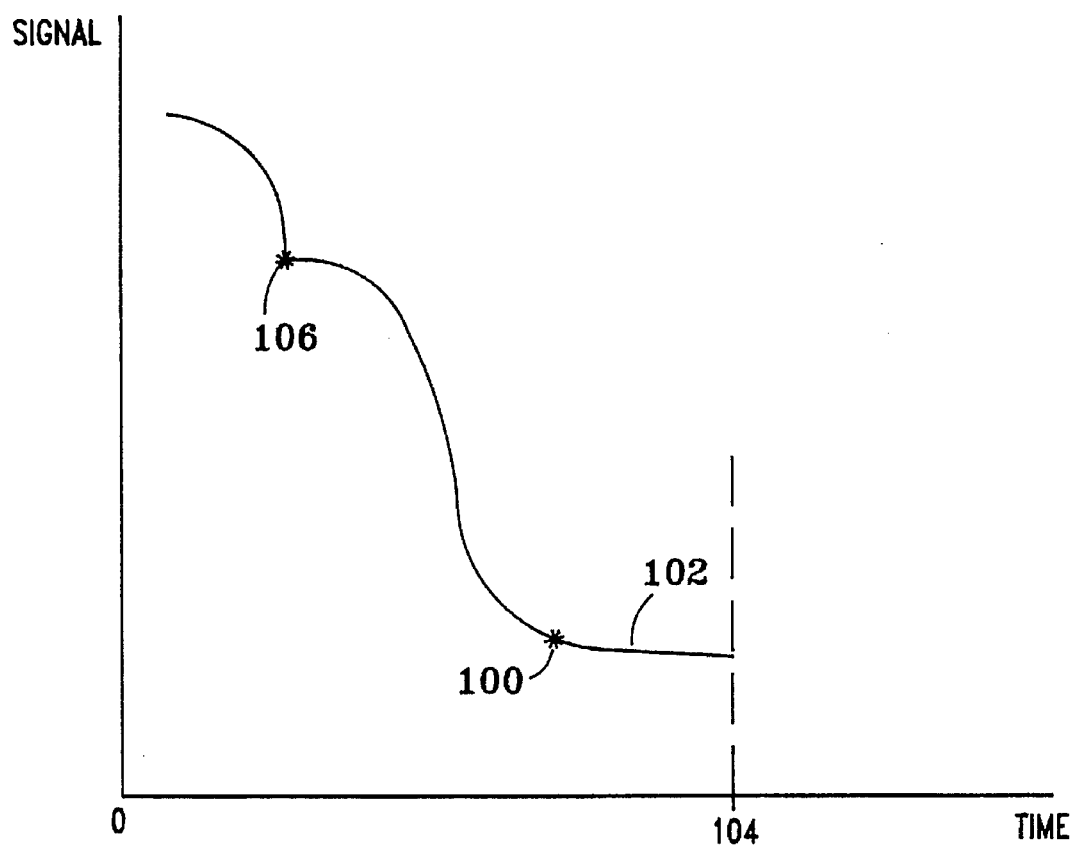

CHEMICAL MECHANICAL POLISHING ENDPOINT PROCESS CONTROL

FIELD OF THE INVENTION

This invention is directed to in-situ endpoint detection for chemical mechanical polishing of semiconductor wafers, and more particularly to a system for data acquisition and control of the chemical mechanical polishing process.

BACKGROUND OF THE INVENTION

In the semiconductor industry, chemical mechanical polishing (CMP) is used to selectively remove portions of a film from a semiconductor wafer by rotating the wafer against a polishing pad (or rotating the pad against the wafer, or both) with a controlled amount of pressure in the presence of a chemically reactive slurry. Overpolishing (removing too much) or underpolishing (removing too little) of a film results in scrapping or rework of the wafer, which can be very expensive. Various methods have been employed to detect when the desired endpoint for removal has been reached, and the polishing should be stopped. One such method described in copending patent application Ser. No. 08/419,206 filed Apr. 10, 1995 entitled "In-Situ Monitoring of the Change in Thickness of Films," assigned to the present assignee, uses a sensor which can be located near the back of the wafer during the polishing process. As the polishing process proceeds, the sensor generates a signal corresponding to the film thickness, and can be used to indicate when polishing should be stopped.

Generating the signal and using the signal to control the CMP process for automatic endpoint detection are two different challenges, however. During polishing, different conditions may arise which can result in the signal falsely indicating that the endpoint has been reached. For example, the film can be locally non-planar (i.e. "cupped") under the sensor, or the film can be multi-layered (i.e. one type of metal over another). In each of these cases, the change in thickness of the film may not be constant and can even stop for a while under the sensor, so that a false endpoint can be detected. Another issue arises due to the fact that while a single sensor can respond to the thickness of a film in the immediate vicinity, it cannot directly monitor the entire film area on the wafer. Thus a certain amount of overpolishing is necessary to ensure that the entire film has been polished, and a way to determine the correct amount of overpolishing. In addition, the polishing process should be able to be easily and quickly custom-tailored to polishing different types of films, so that down time between lots is minimized. Finally, operator training should be easy, with minimal scrapping of wafers, and a polishing history for each wafer kept so that problem determination and resolution is simplified.

Thus there remains a need for a reliable, consistent system for detecting and determining the endpoint for chemical-mechanical polishing which solves the above-listed problems and is suitable for use in large-scale production.

SUMMARY OF THE INVENTION

It is therefore an object of the present invention to provide an endpoint detection system which is capable of distinguishing false endpoint data from the true endpoint.

It is a further object to provide an endpoint detection system which assures the correct amount of overpolishing.

It is another object to provide an endpoint detection system which can be custom-tailored to the wafer product type and thickness.

It is yet another object to provide an endpoint detection system which allows wafer process history to be analyzed.

It is yet another object to provide an endpoint detection system that is easy for operators to learn, with minimal scrapping of wafers.

It is yet a further object to provide an endpoint detection system which is suitable for use in large-scale production.

In accordance with the above listed and other objects, a method and apparatus are provided for determining the endpoint for chemical mechanical polishing a film on a wafer. First, a reference point polishing time indicating when a breakthrough of the film has occurred is determined, then an overpolishing time indicating an interval between the reference point polishing time and when the film has been completely polished is determined. To get the total polishing time to the endpoint, the reference point polishing time and the overpolishing time are added.

BRIEF DESCRIPTION OF THE DRAWINGS

These and other features, aspects, and advantages will be more readily apparent and better understood from the following detailed description of the invention, in which:

FIG. 1 shows a representative signal versus time trace for endpoint detection, in accordance with the present invention.

DESCRIPTION OF THE PREFERRED EMBODIMENTS

Summary of Arrays, Parameters and Calculated Variables

In the description that follows, these arrays, parameters and calculated variables will be used:

ARRAYS
1) Raw data
   A moving array containing $N_{raw}$ data points from the sensor; averaged to give a single trace data point.
2) Reference Point
   A moving array containing $N_{ref}$ most recent trace data points; used to determine a candidate reference point.
3) Jump Height
   A moving array containing $N_{jump}$ most recent trace data points; used to test the trueness of the candidate reference point.

PARAMETERS
1) $N_{raw}$
   The number of raw data points in the raw data array which are averaged to give a single trace data point.
2) $N_{ref}$
   The number of trace data points in the reference point array which are considered for the "flatness" calculation to determine a candidate reference point.
3) $Ref_y$
   The degree of "flatness" acceptable in the reference point array which determines whether a candidate reference point has been reached.
4) $T_{check}$
   The time to start searching for a candidate reference point.
5) $T_{stop}$
   The time at which polishing is stopped if the endpoint has not been detected; used to prevent excessive overpolishing.
6) $N_{jump}$
   The number of trace data points in the jump height array which are considered in testing the trueness of the candidate reference point.

7) $Jump_y$

The acceptable change in signal in the jump height array in order for the candidate reference point to be the true reference point.

8) $Over_{ratio}$

The time for overpolishing past the reference point as a percentage of time to reach the reference point.

9) $Over_{fixed}$

The fixed time for overpolishing past the reference point.

10) $Thick_{act}$

The actual starting thickness of the film on the wafer being polished.

11) $Thick_{std}$

The standard thickness of the manufactured film to be polished.

CALCULATED VARIABLES

1) $R_{max}$, $R_{min}$

The maximum and minimum trace data points in the reference point array.

2) $J_{max}$, $J_{min}$

The maximum and minimum trace data points in the jump height array.

Referring now to the drawing, a signal versus time plot of a typical trace for chemical-mechanical polishing endpoint detection is shown in FIG. 1. On the x-axis, time is given in seconds from the start of polishing. On the y-axis, signal output from the sensor is shown. The sensor (near the film) is coupled to a measurement instrument such as a digital multimeter or frequency counter which is interfaced through a general purpose interface bus (GPIB) card to a computer for monitoring the polishing process. All applicable data is stored in the computer, and the trace shown in FIG. 1 is plotted in real time on the computer display, along with various other values such as process parameters and settings. Note that although the trace shown has a negative slope, depending on the system setup it may have a positive slope.

The sensor signal change (in the preferred embodiment, frequency) is proportional to the change in thickness of the film as it is removed under the sensor. As the thickness decreases, the signal frequency decreases as well. When the film has been polished away under the sensor (i.e. "breakthrough" has occurred), the frequency change associated with the removal of the film will stop and the trace will "flatten" near a fixed frequency value. In FIG. 1, this is indicated by a reference point 100. However, because the polishing rate and the film thickness are not necessarily uniform across the entire wafer, polishing is continued for an interval 102 (known as "overpolishing") until the entire film is removed and polishing is stopped at endpoint 104. If the film and polishing were uniform across the entire wafer, the overpolishing time could be shortened to zero and the reference point and endpoint would be the same.

In order to function effectively, a real time CMP endpoint monitoring scheme must detect the endpoint quickly, preferably in less than 2 seconds. Typically, acquisition of one data point takes approximately 0.65 seconds. To achieve a better signal to noise ratio, post-acquisition signal averaging is necessary. Through experimentation we have found that $N_{raw}=25$ is quite satisfactory for our applications. In order to meet the fast endpoint detection requirement, a moving average is plotted in FIG. 1, with each trace data point being the average of a raw data array with the most recent $N_{raw}$ data points. Each time a new raw data point is acquired from the sensor, the oldest raw data point is discarded from the raw data array, the new raw data point added, and a new average calculated and plotted in the trace. Thus a new trace data point is determined every 0.65 seconds. Of course, depending on the polishing conditions (e.g. polishing rate, type of sensor, detection equipment used, quality of the data, etc) the number of raw data points in the raw data array may vary.

As the trace data points are stored in the computer and plotted in the trace shown in FIG. 1, the system constantly checks to see if a candidate reference point has been reached. A reference point array is used for this purpose. Like the raw data array, the reference point array is a moving array. The reference point array contains the $N_{ref}$ most recently acquired trace data points, with $N_{ref}$ entered as an operating parameter. A typical $N_{ref}$ for our setup is 10.

The check performed to see if a candidate reference point has been reached is essentially a test of how "flat" the trace has become. With each new trace data point added to the reference array and the oldest discarded, the following comparison is made:

$$R_{max}-R_{min} \leq Ref_y \quad (1)$$

where $R_{max}$=maximum value of the trace data points in the reference array $R_{min}$=minimum value of the trace data points in the reference array $Ref_y$=operating parameter, acceptable flatness.

Once equation (1) is satisfied, a candidate reference point is detected and the polishing time to that point becomes the reference point polishing time.

With a typical polishing process, computing equation (1) from the start of polishing may be misleading and inefficient. At the beginning of the trace, strange phenomena may occur, resulting in false data points. One example is if the film under the sensor is cupped or otherwise not planar so that other parts of the film are being polished but the film under the sensor is not. In this case, the trace will be immediately flat and the frequency will not change until the rest of the film has been polished down to the thickness of the area under the sensor. Consideration of these initial false data points can be avoided by letting the process "settle" before reference point checking begins. Equation (1) is thus optionally not calculated until:

$$time \geq t_{check} \quad (2)$$

where time=total polishing time $t_{check}$=operating parameter, time to start checking formula (1).

$T_{check}$ is normally set to a value conservatively smaller than the expected reference point.

Another potentially false reference point can occur with temporary flattening in the middle of a trace before the true reference point is reached, as indicated at 106 in FIG. 1. This can occur as explained above with non-planarity under the sensor during polishing. In order to screen out this type of false reference point a jump height check is made to ensure that approximately the expected amount of signal change has occurred during polishing. For this check, a third array, a jump height array, can be extracted from the data trace kept in the computer. The jump height array is initialized after the candidate reference point is detected, and contains the most recent $N_{jump}$ trace data points, with $N_{jump}$ set to a value conservatively less than the time to the expected reference point divided by the time to acquire each trace data point. If the reference point is expected to occur after 120 seconds, then with 0.65 seconds to acquire each data point, $N_{jump}$ should be set to a value less than 184, and in practice is set between 90–100. For the jump height check, the following formula is used:

$$J_{max} - J_{min} \geq Jump_y \quad (3)$$

where $J_{max}$=maximum value in the jump array $J_{min}$=minimum value in the jump array $Jump_y$=minimum acceptable frequency change over $N_{jump}$ trace data points to be the true reference point.

Once the candidate reference point is found with equation (1) (and optionally equation (2)) and equation (3) is satisfied, the true reference point 100 has been detected. As stated above, the reference point corresponds to when the film immediately under the sensor has been polished away, and breakthrough has occurred. In order to completely polish the entire film, an interval of overpolishing 102 takes place after reference point 100 has been determined. Overpolishing interval 102 is determined according to the equation:

$$t_{ref}(over_{ratio} * thick_{std}/thick_{act}) + over_{fixed} \quad (4)$$

where $t_{ref}$=reference point polishing time $over_{ratio}$=percent of $t_{ref}$ to overpolish $over_{fixed}$=fixed time to overpolish $thick_{std}$=standard film thickness for wafer type $thick_{act}$=actual film thickness of wafer being polished.

If a strictly fixed overpolishing interval is desired, then $over_{ratio}$ is set to zero; if a strict percentage (of the time to reference point) is desired, then $over_{fixed}$ is set to zero; and a mix is also possible with each being non-zero. In practice, we have found that it is necessary to add a factor to the $over_{ratio}$ portion of the equation which takes into account initial film thickness. Usually the initial film thickness is a given constant for a given lot of product wafers and the $thick_{act}/thick_{std}$ will equal one, and thus have no effect on the overpolish time. However, where $thick_{act}$ deviates from $thick_{std}$, the percentage of overpolishing needs to be adjusted accordingly. Thus for a thicker than normal film, the overpolishing percentage will be smaller, and for a thinner than normal film, the percentage will be larger.

The total polishing time to endpoint 104 is thus determined according to:

$$t_{total} = t_{ref}(1 + over_{ratio} * thick_{std}/thick_{act}) + over_{fixed} \quad (5)$$

where $t_{total}$=endpoint polishing time $t_{ref}$=reference point polishing time $over_{ratio}$=percent of $t_{ref}$ to overpolish $over_{fixed}$=fixed time from $t_{ref}$ to overpolish $thick_{std}$=standard film thickness to be polished $thick_{act}$=actual film thickness of wafer being polished.

As a safety precaution, the polishing is stopped if the endpoint has not been reached in a certain time. Thus excessive overpolishing can be prevented and scrapping of the wafer avoided. Thus equation (5) is subject to:

$$t_{total} \leq t_{stop} \quad (6)$$

where $t_{stop}$=time at which polishing is stopped if the endpoint has not been reached.

Parameter Setting

In order to successfully use the above equations, the parameters must be set correctly. To set the parameters $N_{raw}$, $N_{ref}$, $Ref_y$, $t_{check}$, $t_{stop}$, $N_{jump}$, $Jump_y$, $over_{ratio}$ and $over_{fixed}$, so that the true endpoint is successfully determined virtually every time, practice polish runs are required. With our endpoint monitoring system, this is relatively easy to do with our replay mode feature, which minimizes experimentation with product wafers (usually only one test run is required) and results in extremely quick parameter setting during initial system setup.

First, a trace corresponding to the actual CMP process for a real product wafer type must be obtained, i.e. one that leaves no residual film anywhere on the wafer, without unnecessary overpolishing. To get an acceptable trace, a production wafer is polished by an experienced operator/technician with $t_{check}$ and $t_{stop}$ set to a very large number (e.g. 20,000 seconds) so that calculations are not made and polishing will not stop. The trace is monitored by the operator and when it flattens after an expected time has elapsed, polishing is manually stopped. The wafer is cleaned and inspected, and based on experience a reasonable amount of additional polishing time can be determined.

Alternately, $t_{stop}$ can be set to an experienced-based safe value and the wafer is polished to $t_{stop}$, cleaned, and inspected. If the wafer is clean already, another wafer may be polished with an earlier $t_{stop}$ to avoid excess overpolishing. If the wafer is not completely polished and has residual portions remaining, $t_{stop}$ should be increased for the next polish run. Wafers are polished with different $t_{stop}$ values until the wafer is clean with minimal overpolishing, and an acceptable trace is obtained.

Once the acceptable trace is obtained with either method, no more wafers need to be polished in order to set the process parameters. The trace can be replayed with different values for the parameters to insure that the reference point 100, overpolish interval 102, and endpoint 104 are reliably and consistently detected. Once the optimal set of parameters is found, they can be stored in a "recipe," and various recipes can be stored and retrieved based on the type of wafer/film being polished.

Closed Loop Processing

With a reference point determining algorithm and the appropriate overpolishing time set, guarded with the absolute stopping time of $t_{stop}$, the endpoint detection system is capable of automatically running the CMP process from start to finish. The system communicates with the sensor via the GPIB card, as earlier mentioned, and controls the polisher via a data acquisition card, both inside the monitoring computer. When polishing starts, the polisher send a signal to the system, the receipt of which starts data acquisition and display. The system then sends a signal to the polisher to stop once the endpoint is reached, and the data trace is saved for future analysis. The polisher can be set up to run wafers in lots, and so the system then waits for the next start signal from the polisher for the next wafer in the lot. Thus an entire lot of wafers can be processed with minimal operator intervention.

Other Features

Access to various parts of the endpoint detection system are password protected, with separate passwords for the system (machine operator level), data file utilities, recipe creation (engineer level, for parameter setting), and program security.

Polishing of each wafer yields a trace whose data points are saved in a data file. These files can be stored in the endpoint detection system computer or uploaded to a host computer for later study. The data handling portion of the system automatically identifies each wafer and associates it with a wafer lot and recipe used. If process problems occur, then analysis and resolution is much easier.

Note that the use of this type of process control system is not limited to the preferred embodiment, and can be used with a few adjustments to monitor other methods of film removal, for example wet etching, plasma etching, electro-chemical etching, ion milling, etc.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method for determining an endpoint for removing a film from a wafer, comprising the steps of:

determining a reference point removal time indicating when a breakthrough of the film has occurred;

determining an additional removal time indicating an interval between the reference point removal time and when the film has been completely removed;

adding the reference point removal time and the additional removal time to get a total removal time to the endpoint.

2. The method of claim 1 wherein the reference point removal time is determined when a signal output from a sensor responsive to change in thickness of the film no longer changes.

3. The method of claim 2 wherein the signal output from the sensor comprises trace data points, each trace data point being an average of a moving array of raw data points.

4. The method of claim 2 wherein the reference point removal time is determined when a moving reference point array of trace data points is acceptably flat.

5. The method of claim 1 wherein the reference point removal time is determined when the following conditions are met:

$$R_{max} - R_{min} \leq Ref_y, \text{ and}$$

$$J_{max} - J_{min} \geq Jump_4$$

where $R_{max}$=maximum value in the reference point array $R_{min}$=minimum value in the reference point array $Ref_y$=acceptable "flatness" of the moving array $J_{max}$=maximum value in the jump height array $J_{min}$=minimum value in the jump height array $Jump_y$=minimum acceptable frequency change in the jump height array.

6. The method of claim 5 wherein the reference point removal time is determined when the following condition is also met:

$$t_{ref} \geq t_{check}$$

where $t_{check}$=minimum possible $t_{ref}$

7. The method of claim 1 wherein the additional removal time is a fixed time greater than or equal to zero.

8. The method of claim 1 wherein the additional removal time is a percent of the reference point removal time, greater than or equal to zero.

9. The method of claim 1 wherein the additional removal time is determined according to the formula $$t_{ref}*(1+over_{ratio})+over_{fixed}$$

where $t_{ref}$=reference point removal time $over_{ratio}$=percent of $t_{ref}$ to additionally process $over_{fixed}$=fixed time to additionally process.

10. The method of claim 1 wherein the endpoint is determined according to the formula $$t_{total}=t_{ref}(1+over_{ratio}*thick_{act}/thick_{std})+over_{fixed}$$

where $t_{total}$=total removal time to endpoint $t_{ref}$=reference point removal time $over_{ratio}$=percent of $t_{ref}$ to additionally process $over_{fixed}$=fixed to additionally process $thick_{act}$=actual film thickness of wafer being processed $thick_{std}$=standard film thickness for wafer type.

11. The method of claim 10 wherein removal is stopped if $t_{total}$ exceeds a maximum removal time of $t_{stop}$.

12. The method of claim 1 wherein the film is removed by chemical-mechanical polishing.

13. An apparatus for determining an endpoint for removal of a film on a wafer, comprising:

means for determining a reference point removal time indicating when a breakthrough of the film has occurred;

means for determining an additional removal time indicating an interval between the reference point removal time and when the film has been completely removed; and means for adding the reference point removal time and the additional removal time to get a total removal time to the endpoint.

14. The apparatus of claim 13 wherein the reference point removal time is determined when a signal output from a sensor responsive to change in thickness of the film no longer changes.

15. The apparatus of claim 14 wherein the signal output from the sensor comprises trace data points, each trace data point being an average of a moving array of raw data points.

16. The apparatus of claim 14 wherein the reference point removal time is determined when a moving reference point array of trace data points is acceptably flat.

17. The apparatus of claim 13 wherein the reference point removal time is determined when the following conditions are met:

$$|R_{max}-R_{min}| \leq Ref_y, \text{ and}$$

$$|J_{max}-J_{min}| \geq Jump_y$$

where $R_{max}$=maximum value in the reference point array $R_{min}$=minimum value in the reference point array $Ref_y$=acceptable "flatness" of the moving array $J_{max}$=maximum value in the jump height array $J_{min}$=minimum value in the jump height array $Jump_y$=minimum acceptable frequency change in the jump height array.

18. The apparatus of claim 17 wherein the reference point removal time is determined when the following condition is also met:

$$t_{ref} \geq t_{check}$$

where $t_{check}$=minimum possible $t_{ref}$.

19. The apparatus of claim 13 wherein the additional removal time is determined according to the formula $$t_{ref}*(1+over_{ratio})+over_{fixed}$$

where $t_{ref}$=reference point removal time $over_{ratio}$=percent of $t_{ref}$ to additionally process $over_{fixed}$=fixed time to additionally process.

20. The apparatus of claim 13 wherein the endpoint is determined according to the formula $$t_{total}=t_{ref}(1+over_{ratio}*thick_{act}/thick_{std})+over_{fixed}$$

where $t_{total}$=total removal time to endpoint $t_{ref}$=reference point removal time $over_{ratio}$=percent of $t_{ref}$ to additionally process $over_{fixed}$=fixed time to additionally process $thick_{act}$=actual film thickness of wafer being processed $thick_{std}$=standard film thickness for wafer type.

21. The apparatus of claim 20 wherein removal is stopped if $t_{total}$ exceeds a maximum removal time of $t_{stop}$.

22. The apparatus of claim 13 wherein the film is removed by chemical-mechanical polishing.

23. A program storage device readable by a machine, tangibly embodying a program of instructions executable by the machine to perform the method steps for determining an endpoint for removing a film from a wafer, said method steps comprising:

determining a reference point removal time indicating when a breakthrough of the film has occurred;

determining an additional removal time indicating an interval between the reference point removal time and when the film has been completely removed;

adding the reference point removal time and the additional removal time to get a total removal time to the endpoint.

24. The program storage device of claim 22 wherein the film is removed by chemical-mechanical polishing.

* * * * *